(12) United States Patent
Hsu et al.

(10) Patent No.: US 9,192,086 B2
(45) Date of Patent: Nov. 17, 2015

(54) APPLICATION DEVICE FOR SCREEN PROTECTOR AND APPLICATION METHOD THEREOF

(71) Applicant: Chan Jung Hsu, Taipei (TW)

(72) Inventors: Chan Jung Hsu, Taipei (TW); Ching Shan Wu, Taipei (TW)

( * ) Notice: Subject to any disclaimer, the term of this patent is extended or adjusted under 35 U.S.C. 154(b) by 0 days.

(21) Appl. No.: 13/875,067

(22) Filed: May 1, 2013

(65) Prior Publication Data

US 2014/0130971 A1  May 15, 2014

(30) Foreign Application Priority Data

Nov. 13, 2012  (TW) .............................. 101221927 A

(51) Int. Cl.

| | |
|---|---|
| *B29C 65/48* | (2006.01) |
| *B32B 37/12* | (2006.01) |
| *B32B 37/26* | (2006.01) |
| *B32B 38/10* | (2006.01) |
| *H05K 13/00* | (2006.01) |
| *B29C 63/00* | (2006.01) |
| *H04B 1/3888* | (2015.01) |
| *G06F 1/16* | (2006.01) |

(Continued)

(52) U.S. Cl.
CPC ............ *H05K 13/00* (2013.01); *B29C 63/0004* (2013.01); *G06F 1/1626* (2013.01); *H04B 1/3888* (2013.01); *B29C 63/02* (2013.01); *B29C 2063/0008* (2013.01); *B29L 2031/3437* (2013.01); *B29L 2031/3475* (2013.01); *G06F 2200/1634* (2013.01); *H04M 1/0266* (2013.01); *H04M 1/185* (2013.01); *Y10T 156/18* (2015.01)

(58) Field of Classification Search
CPC ...... H05K 13/00; G06F 1/1601; G06F 1/1607; G06F 1/1609; G06F 1/1626; G06F 2200/1634; H01L 21/67132; H01L 21/6835; B29C 66/004; B29C 63/0004; B29C 2063/0008; B29C 63/02; B32B 7/06; B32B 37/12; B32B 37/26; H04B 1/3888; H04M 1/0266; H04M 1/185; B29L 2031/3437; B29L 2031/3475; Y10T 156/18
USPC .......... 156/230, 234, 247, 249, 289, 391, 538
See application file for complete search history.

(56) References Cited

U.S. PATENT DOCUMENTS

| 4,914,842 A | * | 4/1990 | Lieberman ...................... 40/773 |
| 5,704,117 A | * | 1/1998 | Mok et al. ....................... 29/841 |

(Continued)

FOREIGN PATENT DOCUMENTS

WO    WO 2010093100 A1  *  8/2010

*Primary Examiner* — Sing P Chan

(57) ABSTRACT

An application device for a screen protector and an application method thereof are provided for applying an adhesive film to a screen of an electronic device with ease and precision. The application device is formed as a frame-like structure having an internal hollow region. The screen protector includes, from top to bottom, a protective layer, an adhesive film layer, and a release layer sequentially bonded together. The protective layer is greater in area than the adhesive film layer or the release layer and has a peripheral portion extending outwardly beyond the adhesive film layer or the release layer. The peripheral portion of the protective layer is attached to a frame-shaped top surface of the application device while the adhesive film layer and the release layer bonded thereto are placed in, and lie adjacent to a top portion of, the internal hollow region of the application device.

9 Claims, 6 Drawing Sheets

(51) Int. Cl.
*B29L 31/34* (2006.01)
*B29C 63/02* (2006.01)
*H04M 1/02* (2006.01)
*H04M 1/18* (2006.01)

(56) References Cited

U.S. PATENT DOCUMENTS

| | | | |
|---|---|---|---|
| 5,805,251 A * | 9/1998 | Ozawa | 349/110 |
| 5,997,670 A * | 12/1999 | Walter et al. | 156/71 |
| 6,748,993 B1 * | 6/2004 | Shinozaki et al. | 156/391 |
| 6,808,586 B1 * | 10/2004 | Steinhardt | 156/269 |
| 7,080,675 B2 * | 7/2006 | Yamamoto | 156/538 |
| 8,044,942 B1 * | 10/2011 | Leonhard et al. | 345/173 |
| 8,369,072 B1 * | 2/2013 | Alonzo et al. | 361/679.01 |
| 8,671,553 B1 * | 3/2014 | Raisch | 29/602.1 |
| 8,675,353 B1 * | 3/2014 | Alonzo et al. | 361/679.01 |
| 2005/0081726 A1 * | 4/2005 | Anderson | 101/127.1 |
| 2005/0092425 A1 * | 5/2005 | Abe et al. | 156/247 |
| 2008/0117576 A1 * | 5/2008 | Gao et al. | 361/681 |
| 2009/0015509 A1 * | 1/2009 | Gottwald et al. | 343/878 |
| 2010/0053926 A1 * | 3/2010 | Shi et al. | 361/816 |
| 2010/0079972 A1 * | 4/2010 | Chen et al. | 361/818 |
| 2010/0097757 A1 * | 4/2010 | Wang | 361/693 |
| 2013/0010435 A1 * | 1/2013 | Ogatsu | 361/748 |
| 2013/0020020 A1 * | 1/2013 | Liu | 156/247 |
| 2014/0364178 A1 * | 12/2014 | Hynecek et al. | 455/575.8 |

* cited by examiner

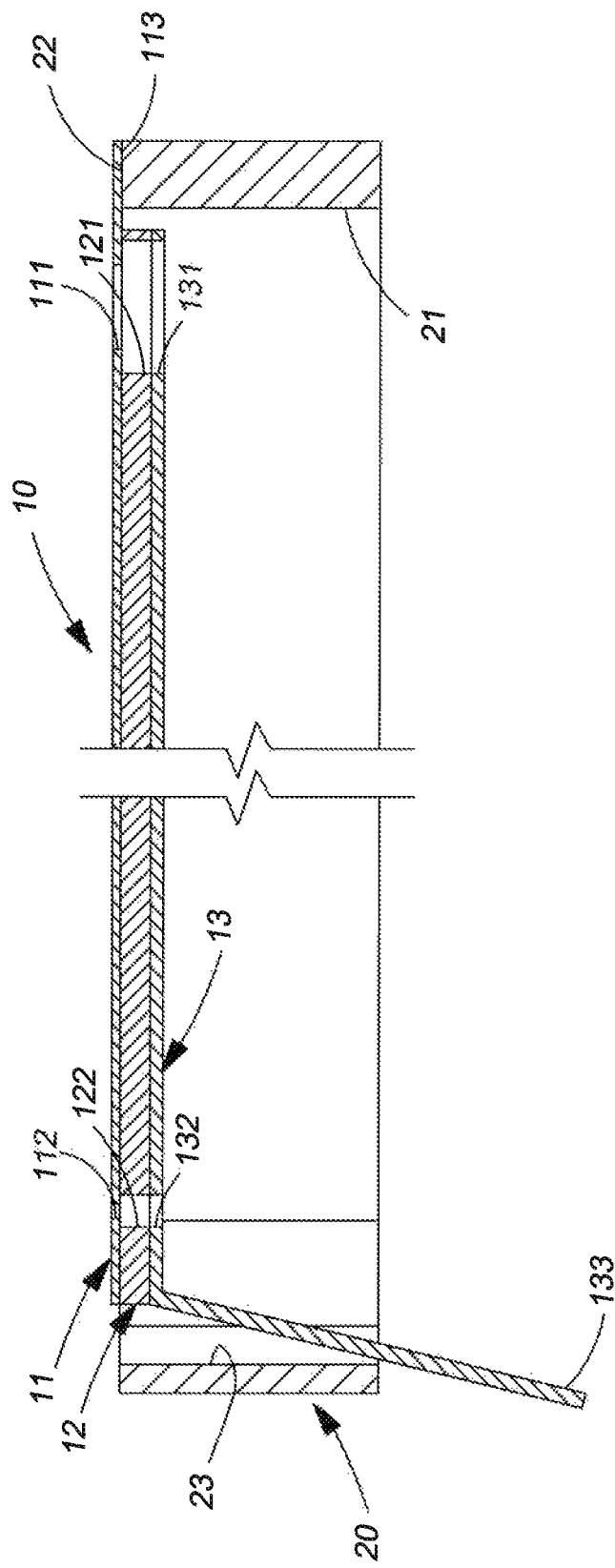

APPLICATION DEVICE FOR SCREEN PROTECTOR AND APPLICATION METHOD THEREOF

BACKGROUND OF THE INVENTION

1. Technical Field

The present invention relates to an application device for a screen protector and an application method thereof. More particularly, the present invention relates to a frame-like device which is integrated with a screen protector and by which the screen protector can be applied with precision.

2. Description of Related Art

It is now common practice to apply a protective plastic film to the display screen of a newly bought mobile phone, laptop computer, tablet computer, or the like. This kind of films, generally known as screen protectors, are transparent thin plastic films capable of protecting screens from damage by an external object without interfering with the display of contents on the screens.

While the advantages of screen protectors ell known, the operation of are applying such films can be a nightmare to many. This is simply because one who has little experience in film application must find it difficult to apply a thin film to the intended position on a screen, not to mention leaving no air bubbles in between the film and the screen after the application.

To enable an amateur to achieve professional film application results, a number of auxiliary tools were developed for the application of screen protectors, some examples of which tools are briefly described below.

U.S. Pat. No. 8,369,072 discloses a screen protector applicator including a cradle and a screen protector placed on the bottom surface of the cradle. Both the cradle and the screen protector are dimensioned and configured to conform to the portable electronic device to which the screen protector is to be applied. By placing the portable electronic device into the cradle, the screen protector is applied to the intended application surface of the portable electronic device. According to the design of U.S. Pat. No. 8,369,072, the screen protector is adhesively attached to the bottom surface of the cradle via a double-sided adhesive tape, and because of that, the following two scenarios may take place during the application process. In the first scenario, the screen protector, even though applied to the application surface of the electronic device with success, is peeled off, or displaced with respect to, the application surface when the electronic device is removed from the cradle. This tends to happen if the double-sided adhesive tape is too tacky, given the fact that the separation between the screen protector and the cradle is a separation between two surfaces. Should the screen protector be displaced, air bubbles may be formed as a result. In the second scenario, the screen protector is separated from the cradle prematurely by a downward pulling force applied to peel off the release film of the screen protector from below, and the second scenario tends to happen if the double-sided adhesive tape is not tacky enough. Therefore, the release film in U.S. Pat. No. 8,369,072 must be carefully peeled off upward to prevent the release film from separation from the cradle, but peeling off the release film upward will expose the screen protector to dust or other sources of contamination.

US20130020020 A1 also discloses a tool for screen protector application and includes a jig composed of a top-layer element, a middle-layer element, and a bottom-layer element which can be separated from one another. An inner portion of the middle-layer element is cut away from the middle-layer element according to the shape of the panel cell phone to which the screen protector is to be applied. Thus, a receiving space is formed in the middle-layer element, and the inner portion cut away from the middle-layer element functions as the bottom-layer element. Moreover, an inner portion of the top-layer element is cut away from the top-layer element according to the shape of the screen protector, thereby forming a space in the top-layer element. To apply the screen protector with the jig, the following steps are performed: removing the bottom-layer element from the jig; inserting the predetermined application surface of the panel cell phone into the receiving space of the middle-layer element from below; inserting an adhesive side of the screen protector into the space of the top-layer element; attaching the adhesive side of the screen protector to the predetermined application surface of the panel cell phone; and removing the panel cell phone from the receiving space of the middle-layer element from below. US20130020020 is flawed in that the thin screen protector is subject to misalignment when being inserted into the receiving space of the top-layer element, and such misalignment will prevent the screen protector from being precisely placed at the intended position on the panel cell phone. Another shortcoming of US20130020020 is that the periphery of the screen protector may inadvertently adhere to the sidewall of the space in the top-layer element, causing air bubbles between the screen protector and the intended application surface of the panel cell phone.

BRIEF SUMMARY OF THE INVENTION

In view of the aforementioned problems associated with application of the conventional screen protectors, the present invention provides a screen protector application device which can effectively assist in the application of a screen protector, allowing the screen protector to be conveniently, precisely, and successfully attached to a screen surface of an electronic device.

To achieve the foregoing object, the present invention provides an application device for a screen protector. According to the first aspect of the application device, the screen protector includes, from top to bottom, a protective layer, an adhesive film layer, and a release layer sequentially bonded together, and the application device is formed as a frame-like structure having an internal hollow region. The protective layer of the screen protector is greater in area than the adhesive film layer or the release layer. Further, the protective layer has a peripheral portion which extends outwardly beyond the adhesive film layer or the release layer and which is attached to a frame-shaped top surface of the application device. The adhesive film layer and the release layer bonded thereto are placed in, and lie adjacent to a top portion of, the internal hollow region of the application device.

Preferably, in the application device described above, the release layer has a lateral side provided with a tongue. The tongue is integrally formed with the release layer, or is externally affixed to an upper surface of an extension portion on the lateral side of the release layer, or is affixed to a bottom side of the release layer. More preferably, the internal hollow region of the application device has a side formed with a notch corresponding in position to the tongue of the release layer so that the tongue of the release layer can extend out through the notch.

According to the second aspect of the application device of the present invention, the screen protector includes, from top to bottom, an adhesive film layer and a release layer bonded together, and the application device is formed as a frame-like structure having an internal hollow region. In addition, an interface layer has a peripheral portion attached to a frame-shaped top surface of the application device. The adhesive film layer of the screen protector is attached to a bottom portion of the interface layer and is placed in the internal hollow region of the application device, lying adjacent to a top portion of the internal hollow region.

According to the second aspect of the application device, the area of the interface layer is preferably smaller or greater than the area enclosed by the outer counter of the application device, and the bottom surface of the interface layer preferably has a low-tack adhesive layer, thus enabling the interface layer to adhere to the frame-shaped top surface of the application device and to the adhesive film layer. Preferably, the interface layer is free of openings or grooves.

According to the second aspect of the application device, the release layer preferably has a lateral side provided with a tongue, and the tongue is integrally formed with the release layer, or is externally affixed to an upper surface of an extension portion on the lateral side of the release layer, or is affixed to a bottom side of the release layer.

The present invention also includes a method for applying a screen protector to an electronic device, wherein the method is carried out in the following manner:

To begin with, a bottom release layer of the screen protector is peeled off downward. The screen protector has, as its top layer, a protective layer or an interface layer affixed to a top surface of an application device. The application device is a frame-like structure having an internal hollow region. The screen protector further has a middle adhesive film layer which, together with the bottom release layer, is placed in, and lies adjacent to a top portion of, the internal hollow region of the application device.

Next, the internal hollow region of the application device is mounted on the outer frame of the electronic device to which the screen protector is to be applied.

After that, the bottom surface of the middle adhesive film layer of the screen protector is brought into contact with the intended application surface of the electronic device to cover the intended application surface.

Then, the application device is forcibly moved downward, thereby separating the protective layer or the interface layer of the screen protector from the top surface of the application device.

Lastly, the protective layer or the interface layer of the screen protector is peeled off, starting from a corner of the screen protector, such that the protective layer or the interface layer is separated from the electronic device.

The screen protector application device and the application method described above are so designed that the adhesive film layer can be precisely and compliantly affixed to a screen or back panel of an electronic device without previous training. Moreover, according to the application method of the present invention, the peeling of the protective layer or the interface layer starts from a corner of the screen protector, meaning the force required for peeling is much smaller than that required in U.S. Pat. No. 8,369,072 to peel the screen protector off the bottom surface of the cradle. Therefore, the present invention will neither cause displacement of the screen protector nor give rise to air bubbles. Further, as the protective layer or the interface layer of the present invention is affixed, with most of its bottom surface, to the adhesive film layer, the adhesion between the protective/interface layer and the adhesive film layer is greater than that between the adhesive film layer and the release layer. This allows the release layer to be peeled off downward, thereby preventing dust from falling onto the adhesive film layer. All of the above are advantages of the present invention over the conventional screen protectors.

BRIEF DESCRIPTION OF THE SEVERAL VIEWS OF THE DRAWINGS

The features as well as the preferred modes of implementation of the present invention will be best understood by referring to the following detailed description of some illustrative embodiments in conjunction with the accompanying drawings, in which:

FIG. 3 is a front sectional view of the screen protector application device according to the first preferred embodiment of the present invention;

DETAILED DESCRIPTION OF THE INVENTION

Figure 1:
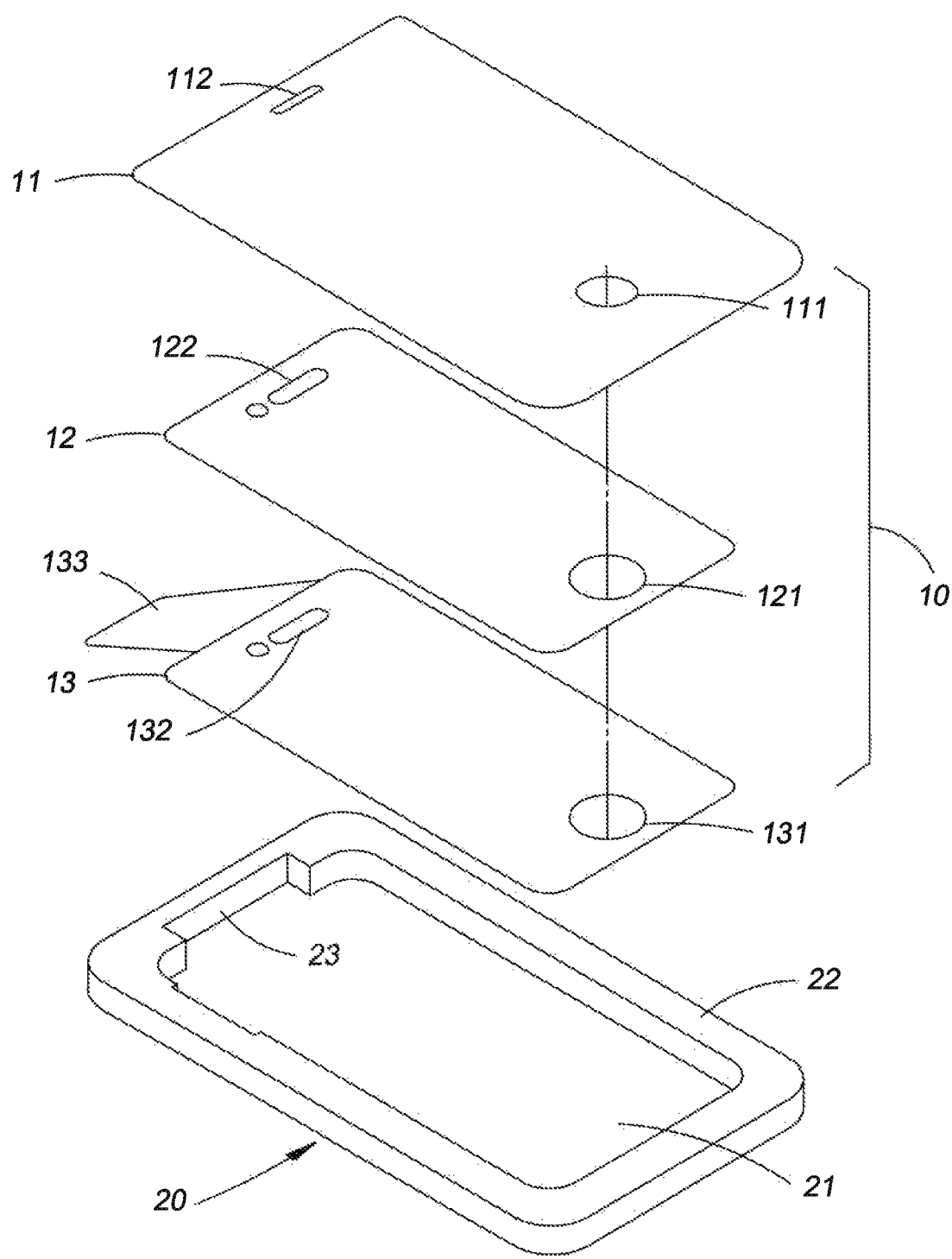
FIG. 1 is an exploded perspective view of the screen protector application device according to the first preferred embodiment of the present invention.
Figure 2:
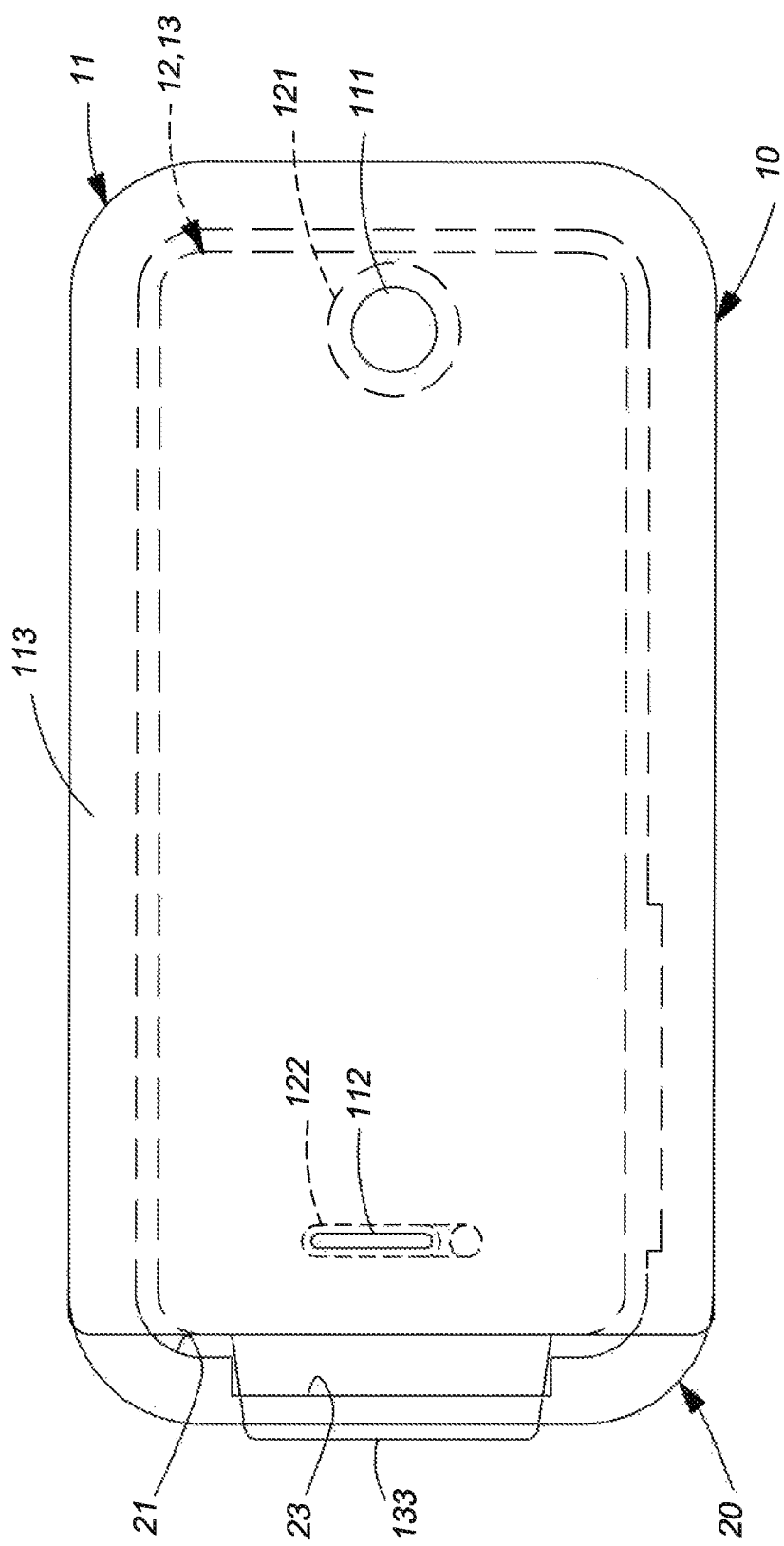
FIG. 2 is an assembled top view of the screen protector application device according to the first preferred embodiment of the present invention.

In the first preferred embodiment of the present invention as shown in FIG. 1 and FIG. 2, an application device for a screen protector includes a screen protector 10 and an application device 20. The screen protector 10 includes, from top to bottom, a protective layer 11, an adhesive film layer 12, and a release layer 13 sequentially bonded together. In terms of area, the protective layer 11 is greater than the adhesive film layer 12 or the release layer 13, and the adhesive film layer 12 is generally as large as or is smaller than the release layer 13. Thus, the adhesive film layer 12 is completely covered by the protective layer 11 and the release layer 13 from both sides and is fully protected from dust or other sources of contamination before use. The openings 111, 121, 131 and the grooves 112, 122, 132 in the protective layer 11, the adhesive film layer 12, and the release layer 13 correspond respectively to apertures reserved for the functional structures (e.g., loudspeakers and buttons) of the electronic device (not shown) to which the screen protector 10 is to be applied. That is to say, the positions and shapes of the openings 111, 121, 131 and of the grooves 112, 122, 132 may vary with such functional structures.

The application device 20 of the present invention is formed as a frame-like structure having an internal hollow region 21. The application device 20 also has a certain thickness so that it can be easily held by hand during the screen protector application process.

Referring to FIG. 1, FIG. 2, and FIG. 3, the protective layer 11 of the screen protector 10 in the first preferred embodiment has a peripheral portion 113 extending outwardly beyond the adhesive film layer 12 or the release layer 13. The peripheral portion 113 is attached to a frame-shaped top surface 22 of the application device 20 while the adhesive film layer 12 and the release layer 13 bonded thereto are placed in the internal hollow region 21 of the application device 20 and lie adjacent to a top portion of the internal hollow region 21. In this preferred embodiment, one lateral side of the release layer 13 is provided with a tongue 133, and the side of the internal hollow region 21 of the application device 20 that corresponds in position to the tongue 133 is formed with a notch 23. When the release layer 13 is placed in the internal hollow region 21, the tongue 133 extends outward from a bottom portion of the application device 20 through the notch 23. By pulling the tongue 133, the release layer 13 can be easily peeled off the adhesive film layer 12.

Figure 4A:
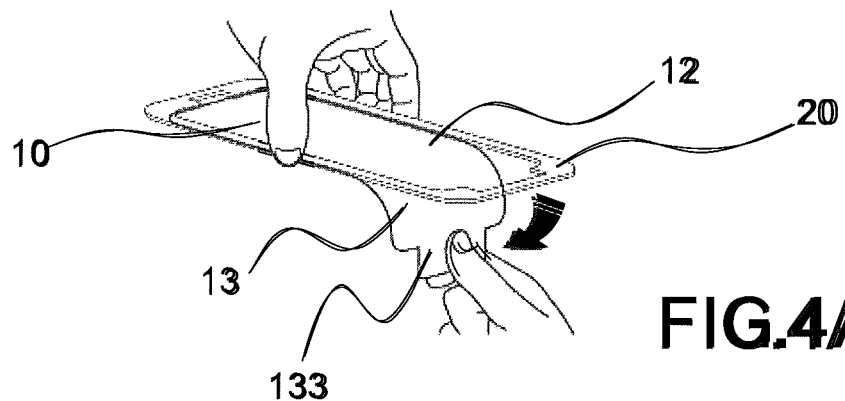
FIG. 4A~FIG. 4D schematically show how a screen protector is applied to a surface of an electronic device by means of the screen protector application device according to the first preferred embodiment of the present invention.
Figure 4B:
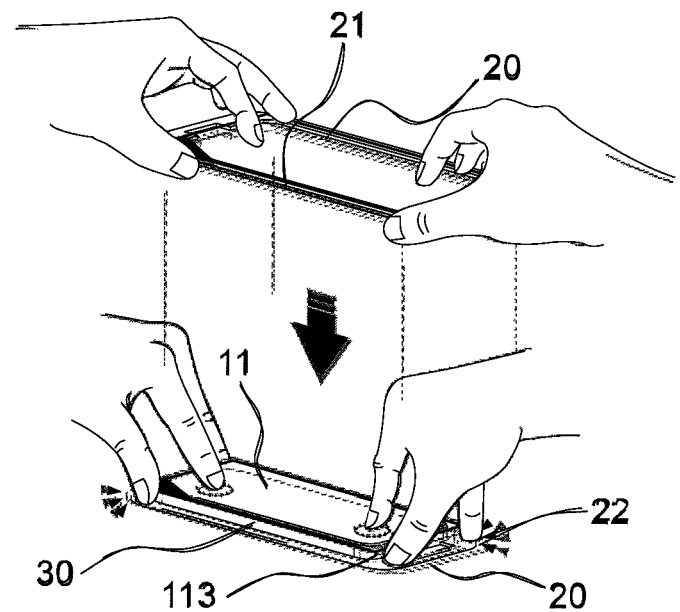
Figure 4C:
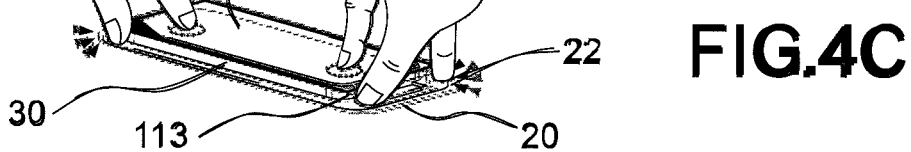
Figure 4D:
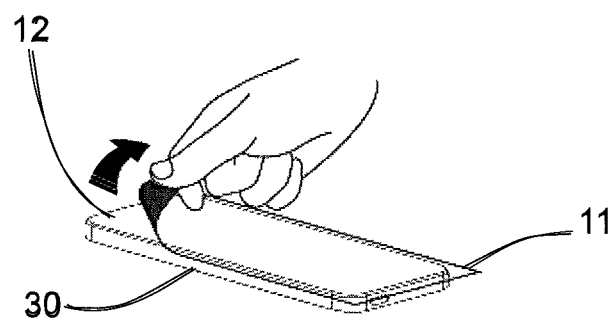

FIG. 4A~FIG. 4D illustrate how the application device 20 in the first preferred embodiment is operated. Before operation, it is advisable to remove any existing screen protector from the to-be-protected electronic device and clean the intended application surface of the electronic device. Then, the application device 20 is operated by the following steps. To start with, the release layer 13 is peeled off the adhesive film layer 12 by pulling the tongue 133 of the release layer 13 downwardly and outwardly of the application device 20 (FIG. 4A). Next, the internal hollow region 21 of the application device 20 is mounted on the outer frame of the electronic device 30 to which the screen protector 10 is to be applied (FIG. 4B). During the mounting process, the bottom surface of the application device 20 is preferably held parallel to the intended application surface of the electronic device 30. Once the adhesive film layer 12 of the screen protector 10 moving downward with the application device 20 contacts with the application surface of the electronic device 30, the adhesive film layer 20 will rapidly and compliantly attach to and thus cover the intended application surface of the electronic device 30. By applying a slight force to the application device 20 and moving it further downward, the peripheral portion 113 of the protective layer 11 is forced to detach from the frame-shaped top surface 22 of the application device 20; as a result, the screen protector 10 is separated from the application device 20 completely (FIG. 4C). In the final step, the electronic device 30 is separated from the application device 20, and the protective layer 11 is peeled off, starting from a corner of the screen protector 10 (FIG. 4D). Thus, the adhesive film layer 12 is adhesively and precisely attached to the intended position on the surface of the electronic device 30.

In the first preferred embodiment described above, the internal hollow region 21 of the application device 20 may vary in shape and size with the electronic device on which the internal hollow region 21 is to be mounted. Also, the gap between the internal hollow region 21 and the contour of the electronic device can be adjusted according to the desired degree of fit.

Figure 5:
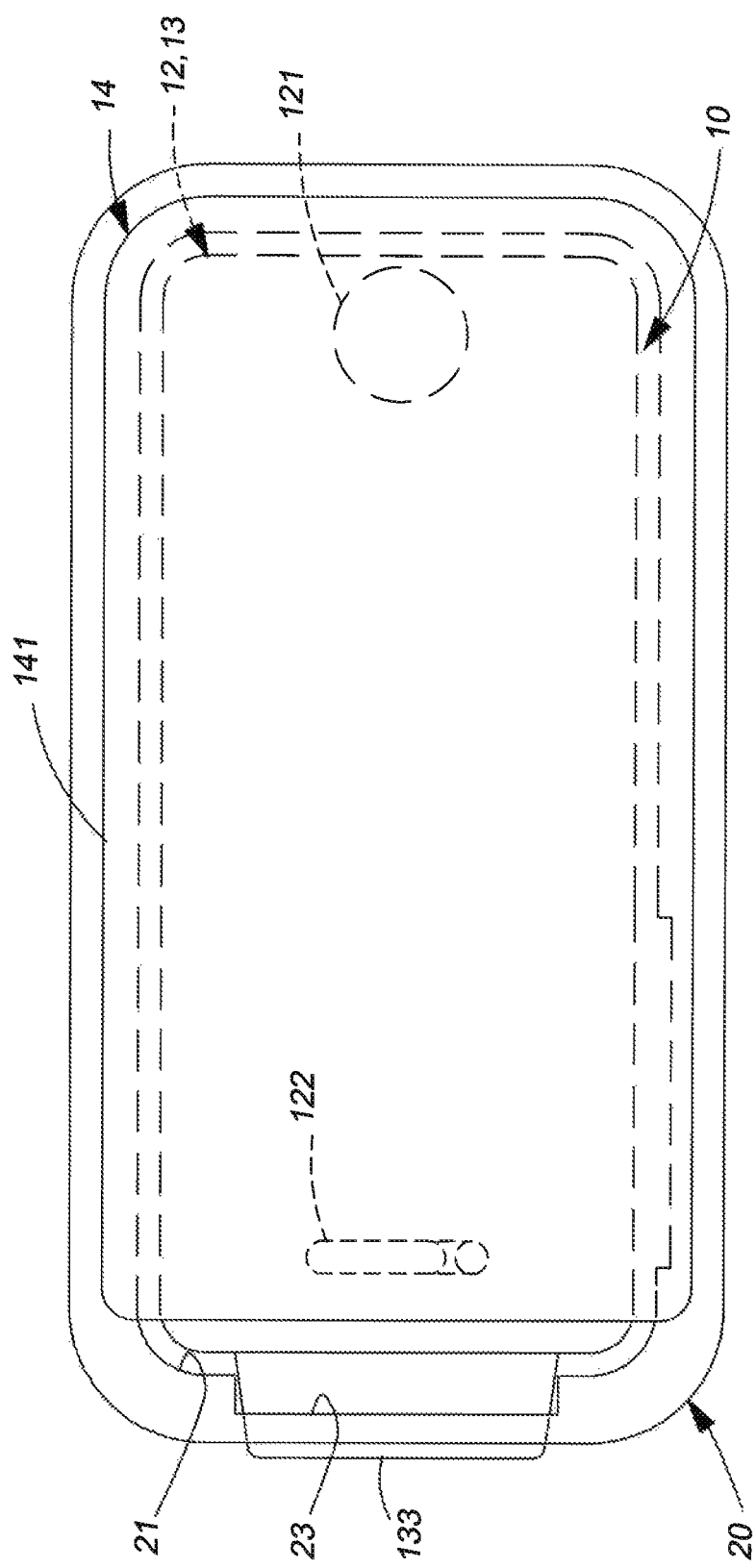
FIG. 5 is an assembled top view of the screen protector application device according to the second preferred embodiment of the present invention.
Figure 6:
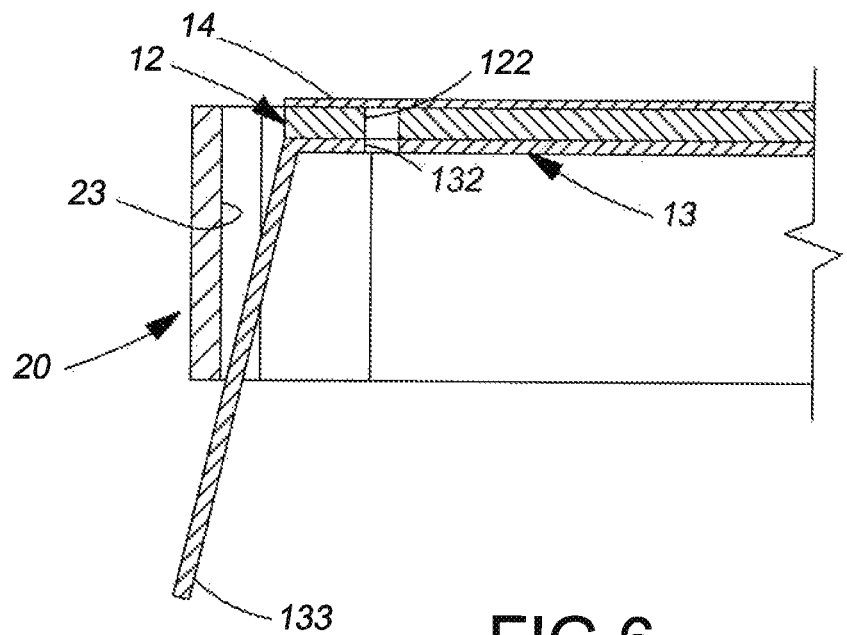
FIG. 6 is a partial front sectional view of the screen protector application device according to the second preferred embodiment of the present invention.

While the screen protector 10 for use with the application device 20 in the first preferred embodiment includes, from top to bottom, the protective layer 11, the adhesive film layer 12, and the release layer 13 sequentially bonded together, the screen protector in other embodiments may include only the adhesive film layer and the underlying release layer. For example, in the second preferred embodiment of the pies invention as shown in FIG. 5 and FIG. 6, the screen protector only includes, from top to bottom, the adhesive film layer 12 and the release layer 13 bonded together. The protective layer 11 in the first preferred embodiment is defined in the second preferred embodiment as a connecting layer or interface layer 14 for attaching the screen protector to the frame-shaped top surface of the application device 20. More particularly, the interface layer 14 serves to enable placement of the screen protector at an appropriate position in the internal hollow region 21 of the application device 20 so that the screen protector can subsequently adhere to the surface of an electronic device with precision.

In the second preferred embodiment, the area of the interface layer 14 is still greater than that of the adhesive film layer 12 or the release layer 13 bonded thereto but can be slightly smaller than the area enclosed by the outer contour of the application device 20. As shown in FIG. 5, the peripheral portion 141 of the interface layer 14 stays within and is spaced from the outer contour of the application device 20.

In the second preferred embodiment, the bottom surface of the interface layer 14 preferably has a low-tack adhesive layer (not shown) to enable adhesive attachment not only between the peripheral portion 141 of the interface layer 14 and the frame-shaped top surface of the application device 20, but also between the interface layer 14 and the adhesive film layer 12.

In the second preferred embodiment, the function of the interface layer 14 is to affix the adhesive film layer 12 and the release layer 13 to the application device 20 and is therefore different from the function of the protective layer 11 in the first preferred embodiment. And because of that, the interface layer 14 in the second preferred embodiment need not be provided with the opening 111 and the groove 112 of the protective layer 11, as shown in FIG. 6.

Figure 7:
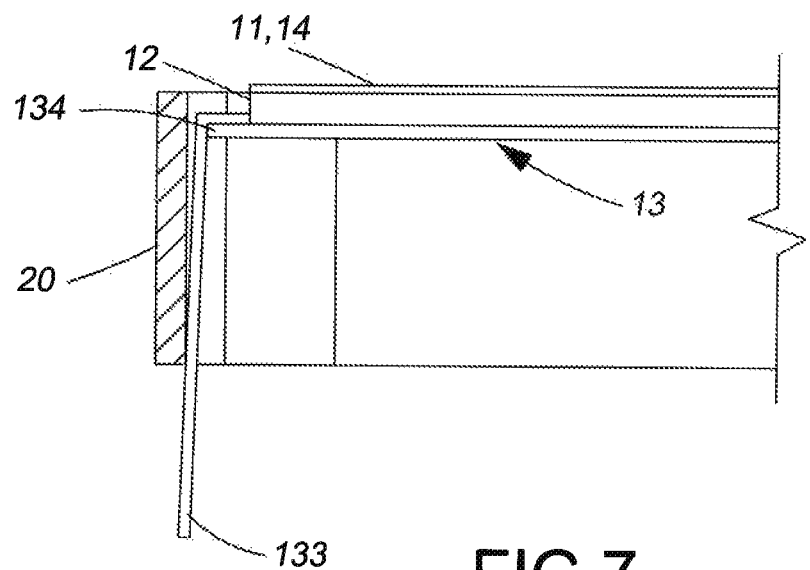
FIG. 7 is a partial front sectional view of the screen protector application device according to the third preferred embodiment of the present invention, showing in particular a tongue externally affixed to the upper surface of an extension portion on a lateral side of a release layer.

In the second as well as the first preferred embodiment, the release layer 13 has a lateral side integrally formed with an outwardly extending tongue 133 to facilitate the peeling of the release layer 13 off the adhesive film layer 12. In the third preferred embodiment of the present invention as shown in FIG. 7, however, the tongue 133 is externally affixed to the upper surface of an extension portion 134 on a lateral side of the release layer 13.

The embodiments described above serve only to illustrate the preferred modes of implementing the present invention but are not intended to be restrictive of the scope of the present invention. A person of ordinary skill in the art who has read the foregoing technical description may change or modify the embodiments without departing from the technical concept of the present invention. The scope of the present invention is defined only by the appended claims.

What is claimed is:

1. An application device for a screen protector comprising:
 a frame-like structure with an internal hollow region and having a top portion and a bottom, wherein the hollow region is configured to conform a corresponding electronic device from the bottom; and
 the screen protector, from bottom to top, comprising
  a release layer being placed inside the hollow region, and being configured to be peeled before installing the screen protector to the electronic device;
  a adhesive film layer being bonded to the release layer, being placed inside the hollow region, and being configured to attach to an application surface of the electronic device; and
  a protective layer being bonded to the adhesive film layer, being attached on the top portion of the frame-like structure, and being configured to be detached from the frame-like structure by peeling off from the adhesive film layer on the application device or on the electronic device.

2. The application device as claimed in claim 1, wherein the the protective layer has peripheral portion extended outwardly beyond the release layer and the adhesive film layer, and the peripheral portion is attached to the top portion of the frame-like structure.

3. The application device of claim 1, wherein the release layer has a lateral side provided with a tongue.

4. The application device of claim 3, wherein the tongue is integrally formed with the release layer.

5. The application device of claim 3, wherein the tongue is externally affixed to an upper surface of an extension portion on the lateral side of the release layer.

6. The application device of claim 3, wherein the tongue is affixed to a bottom side of the release layer.

7. The application device of claim 3, wherein the internal hollow region of the application device has a side formed with a notch corresponding in position to the tongue of the release layer, and the tongue of the release layer extends out through the notch.

8. A method for applying a screen protector to an electronic device, comprising steps of:
   providing the screen protector to an application device, wherein the application device being a frame-like structure having an internal hollow region, and the screen protector is initially formed with, from bottom to top, a release layer, the adhesive film layer and a protective layer, the release layer and the adhesive film layer are placed inside the hollow region, and the protective layer is attached on a top portion of the application device;
   peeling off the release layer of the screen protector, wherein
   mounting the internal hollow region of the application device downward on an outer frame of the electronic device to which the screen protector is to be applied;
   contacting the adhesive film layer of the screen protector with an intended application surface of the electronic device; and
   peeling off the protective layer from the adhesive film layer.

9. The method as claimed in claim 8, further comprising:
   moving the application device forcibly downward to separate the protective layer before peeling off the protective layer from the adhesive film layer.

* * * * *